(12) United States Patent
McHugh et al.

(10) Patent No.: US 7,754,185 B2
(45) Date of Patent: Jul. 13, 2010

(54) METHOD OF MAKING $MoO_2$ POWDERS, PRODUCTS MADE FROM $MoO_2$ POWDERS, DEPOSITION OF $MoO_2$ THIN FILMS, AND METHODS OF USING SUCH MATERIALS

(75) Inventors: Lawrence F. McHugh, North Andover, MA (US); Prabhat Kumar, Framingham, MA (US); David Meendering, Coldwater, MI (US); Richard Wu, Chelmsford, MA (US); Gerhard Wötting, Coburg (DE); Richard Nicholson, Chardon, OH (US)

(73) Assignee: H.C. Starck Inc., Newton, MA (US)

( * ) Notice: Subject to any disclaimer, the term of this patent is extended or adjusted under 35 U.S.C. 154(b) by 1211 days.

(21) Appl. No.: 11/334,140

(22) Filed: Jan. 18, 2006

(65) Prior Publication Data

US 2006/0165572 A1 Jul. 27, 2006

(51) Int. Cl.
*C01G 39/02* (2006.01)
*B22F 3/15* (2006.01)

(52) U.S. Cl. ............................. 423/606; 419/26; 419/49

(58) Field of Classification Search ................. 420/429; 419/28, 29, 26; 423/606
See application file for complete search history.

(56) References Cited

U.S. PATENT DOCUMENTS

| 4,491,560 | A | * | 1/1985 | Fujii et al. .................. 420/429 |
| 4,595,412 | A | | 6/1986 | Brunelli et al. .......... 75/0.5 BB |
| 2002/0028538 | A1 | * | 3/2002 | Parfeniuk et al. ........... 438/118 |

OTHER PUBLICATIONS

ABCR GMBH&CO, Karlsruhe: "AVOCADO/ABCR Catalogue 2000-2001: Chemical for Research and Development" 2001, Avocado Research Chemicals, XP002337567 Product N° 21982 Molybdenum (IV) Oxide, 99.95% p. 774.
T. Ressler, J. Wienold, R.E. Jentoft: "Formation of bronzes during temperature-programmed reduction of $MoO_3$ with hydrogen—an in situ XRD and XAFS study" Solid State Ionics, vol. 141-142, 2001, pp. 243-251, XP002337409.
Patent Abstracts of Japan vol. 12, No. 237 (C-509), Jul. 6, 1988 & JP 63 030321 A (Tokyo Tungsten Co Ltd), Feb. 9, 1988.
Patent Abstracts of Japan, vol. 13, No. 15 (C-559) Jan. 13, 1989 & JP 63 222015 A (Agency of Ind Science & Technol), Sep. 14, 1988.

\* cited by examiner

*Primary Examiner*—Stanley Silverman
*Assistant Examiner*—James Fiorito
(74) *Attorney, Agent, or Firm*—Connolly Bove Lodge & Hutz LLP

(57) ABSTRACT

The invention relates to high purity $MoO_2$ powder by reduction of ammonium molybdate or molybdenum trioxide using hydrogen as the reducing agent in a rotary or boat furnace. Consolidation of the powder by press/sintering, hot pressing, and/or HIP is used to make discs, slabs, or plates, which are used as sputtering targets. The $MoO_2$ disc, slab, or plate form is sputtered on a substrate using a suitable sputtering method or other physical means to provide a thin film having a desired film thickness. The thin films have properties such as electrical, optical, surface roughness, and uniformity comparable or superior to those of indium-tin oxide (ITO) and zinc-doped ITO in terms of transparency, conductivity, work function, uniformity, and surface roughness. The $MoO_2$ and $MoO_2$ containing thin films can be used in organic light-emitting diodes (OLED), liquid crystal display (LCD), plasma display panel (PDP), field emission display (FED), thin film solar cell, low resistivity ohmic contacts, and other electronic and semiconductor devices.

6 Claims, No Drawings

METHOD OF MAKING $MoO_2$ POWDERS, PRODUCTS MADE FROM $MoO_2$ POWDERS, DEPOSITION OF $MoO_2$ THIN FILMS, AND METHODS OF USING SUCH MATERIALS

BACKGROUND

The present invention relates to a method of making high purity $MoO_2$ and in particular to near theoretical density $MoO_2$ plates, products containing such plates.

Indium-tin oxide (ITO) zinc-doped ITO, and aluminum-doped ZnO are typical sputtering target materials However, when they are used in applications, as for instance in organic light-emitting diodes, their work function (typically about 4.7 eV) does not match well with the desired light emitting function.

It would be desirable to provide a sputtering target material that could be used to make organic light-emitting diodes that do not have the problems and limitations of ITO and zinc-doped ITO sputtering target materials.

SUMMARY

The invention relates to high purity $MoO_2$ powder by reduction of ammonium molybdate or molybdenum trioxide using hydrogen as the reducing agent in a rotary or boat furnace. Consolidation of the powder by press/sintering, hot pressing, and/or HIP is used to make discs, slabs, or plates, which are used as sputtering targets. The $MoO_2$ disc, slab, or plate form is sputtered on a substrate using a suitable sputtering method or other physical means to provide a thin film having a desired film thickness. The thin films have properties such as electrical, optical, surface roughness, and uniformity comparable or superior to those of indium-tin oxide (ITO), zinc-doped ITO, and aluminum-doped ZnO in terms of transparency, conductivity, work function, uniformity, and surface roughness. The thin films can be used in organic light-emitting diodes (OLED), liquid crystal display (LCD), plasma display panel (PDP), field emission display (FED), thin film solar cell, low resistivity ohmic contacts, and other electronic and semiconductor devices.

DESCRIPTION

Other than in the operating examples or where otherwise indicated, all numbers or expressions referring to quantities of ingredients, reaction conditions, etc., used in the specification and claims are to be understood as modified in all instances by the term "about." Various numerical ranges are disclosed in this patent application. Because these ranges are continuous, they include every value between the minimum and maximum values. Unless expressly indicated otherwise, the various numerical ranges specified in this application are approximations.

As used herein, the term "high purity $MoO_2$" refers to materials and compounds that contain greater than 99.95% by weight $MoO_2$ and at least 99% by weight $MoO_2$ phase.

As used herein, the term "stoichiometric $MoO_2$ powder" refers to a powder that contains a stated percentage of $MoO_2$, i.e., Mo and O in a ratio of 1:2. As a non-limiting example, a 99% stoichiometric $MoO_2$ powder would contain 99% $MoO_2$ powder and 1% of another material, a non-limiting example of such being $MoO_3$.

The present invention generally provides high purity $MoO_2$ powder by reduction of ammonium molybdate or molybdenum trioxide using hydrogen as the reducing agent in a rotary or boat furnace. Consolidation of the powder by press/sintering, hot pressing, and/or HIP is used to make discs, slabs, or plates, which are used as sputtering targets. The $MoO_2$ disc, slab, or plate form is sputtered on a substrate using a suitable sputtering method or other physical means to provide a thin film having a desired film thickness. The thin films have properties such as electrical, optical, surface roughness, and uniformity comparable or superior to those of indium-tin oxide (ITO), zinc-doped ITO and aluminum-doped ZnO in terms of transparency, conductivity, work function, uniformity, and surface roughness. The thin films can be used in organic light-emitting diodes and other electronic and semiconductor devices.

As used herein, the term "work function" refers to the energy needed to move an electron in an atom from the Fermi level to vacuum level, i.e., outside of the atom. In the present invention, the work function will vary depending on surface conditions, for example, impurities.

As used herein, the term "organic light-emitting diode" refers to electronic devices made by placing a series of organic thin films between two conductors. When electrical current is applied, a bright light is emitted, typically via electrophosphorescence.

An embodiment of the present invention is directed to a method of making high purity $MoO_2$ powder. The method includes:

(a) placing a molybdenum component into a furnace; and (b) heating the molybdenum component in a furnace containing a reducing atmosphere.

In an embodiment of the invention, any suitable molybdenum source can be used as the molybdenum component. Suitable molybdenum sources include compounds that can provide high purity $MoO_2$ when used in the present method. Suitable sources for the molybdenum component include, but are not limited to, ammonium dimolybdate salt, molybdenum trioxide, and combinations thereof.

In an embodiment of the invention, the molybdenum component is heated to a sufficiently high temperature to convert the molybdenum component to high purity $MoO_2$, typically greater than 99% stoichiometric $MoO_2$ powder. The furnace temperature in the present method can be less than 1,250° C., in some cases less than 1,000° C., in other cases less than 800° C., in some situations less than less than 700° C., and in other situations less than 650° C. Also, the furnace temperature in the present method can be at least 100° C., in some cases at least 250° C., and in other cases at least 500° C. The furnace temperature can be any of the stated temperatures or it can range between any of the furnace temperature values stated above.

In an embodiment of the invention, the molybdenum component is heated at the furnace temperature for a period of time sufficient to convert the molybdenum component to high purity $MoO_2$, typically greater than 99% stoichiometric $MoO_2$ powder. The period of time can vary depending on the furnace temperature, where higher temperatures generally result in shorter required heating times. The heating time can be at least 5 minutes, in some cases at least 10 minutes, in other cases at least 15 minutes, in some situations at least 30 minutes, in other situations at least 45 minutes, in some circumstances at least one hour, and in other circumstances at least 90 minutes. Also, the heating time can be up to 8 hours, in some cases up to 6 hours, in other cases up to 5 hours, in some situations up to 4 hours, and in other situations up to 3 hours. The period of time the molybdenum component is heated at the furnace temperature can be any of the stated periods of time or can range between any of the periods of time stated above.

Any suitable furnace can be used in the present invention. Suitable furnaces include those that can expose the molybdenum component to the desired temperatures for the desired periods of times indicated above and under desired environments and/or atmospheres. Suitable furnaces that can be used in the present invention include, but are not limited to, stationary tube furnaces, rotary tube furnaces, and calciners.

Any suitable atmosphere can be used in the furnace of the present invention. Suitable atmospheres promote the formation of high purity $MoO_2$, typically greater than 99% stoichiometric $MoO_2$ powder. In an embodiment of the present invention, a reducing atmosphere is employed in the furnace. In a particular embodiment of the present invention, the reducing atmosphere includes hydrogen. In an embodiment of the present invention, the molybdenum component is placed in a flat-bottomed boat, which is placed in a furnace and heated in a desired atmosphere as described above. In a particular embodiment, 6.8 kg of ammonium dimolybdate is placed in a flat-bottomed boat and the boat is heated in a stationary tube furnace for from two to three hours at a temperature ranging from 500° C. to 700° C.

In an embodiment of the present invention, the method of making high purity $MoO_2$ powder provides $MoO_2$ powder comprising greater than 99% by weight of a stoichiometric amount of $MoO_2$.

The $MoO_2$ powder can be characterized as having an average particle size of at least 0.1 μm, in some cases at least 0.5 μm, and in other cases at least 1 μm. Also, the $MoO_2$ powder can have an average particle size of up to 50 μm, in some cases up to 100 μm. The average particle size of the $MoO_2$ powder can be any of the stated values or can range between any of the values stated above.

A further embodiment of the present invention is directed to a method for making a plate that includes:

(A) isopressing a greater than 99% stoichiometric $MoO_2$ powder component to a billet;

(B) vacuum and/or pressure sintering the billet under conditions to maintain the greater than 99% $MoO_2$ stoichiometry; and (C) forming a plate that includes greater than 99% stoichiometric $MoO_2$ In another embodiment, the invention involves a method for making a plate that includes subjecting a greater than 99% stoichiometric $MoO_2$ powder component to hot pressing conditions, and thereby forming a plate that includes greater than 99% stoichiometric $MoO_2$ Hot pressing conditions generally occur at high pressure, such that a plate forms with a low strain rate at a temperature high enough to induce a sintering process and a creep process. For $MoO_2$, it generally requires 1000+ C. to reach a desired density. In one embodiment where the plate is made under hot pressing conditions, the hot pressing step is carried out with transient liquid phase assisted hot pressing, a pressing technique that involves powder consolidation at a temperature where liquid and solid phases coexist due to chemical reactions, partial melting, or eutectic liquid formations.

In one embodiment, the plate made in accordance to the invention is made into a sputtering target. The sputtering target is made by subjecting the plate including greater than 99% stoichiometric $MoO_2$ to machining until a sputtering target having desired properties and/or dimensions is obtained. The machining the plate is subjected can include any machining suitable for making sputtering targets having suitable properties/dimensions. Examples of suitable machining steps include but are not limited to laser cutting, milling, turning, and lathe-techniques. The sputtering target may be polished to improve its surface roughness. Examples of suitable diameters for circular sputtering targets, for instance, can range from 1 inch (2.54 cm) to 25 inches (63.5 cm), preferably from four inches (10.2 cm) to eight inches (20.4 cm). Examples of suitable thicknesses for such circular sputtering targets can range from ⅛ inch (0.3 cm) to two inches, three inches, four inches, five inches, or more, and preferably less than one inch (less than 2.54 cm).

Any suitable pressure to form a individual billet can be applied when the $MoO_2$ powder is isopressed. Suitable pressures are those that allow a metal-powder compact to form between the $MoO_2$ powder and the billet. The pressure can be at least 5,000 psi, in some cases at least 7,500 psi, in other cases at least 10,000 psi, in some situations at least 15,000 psi, and in other cases at least 20,000 psi. Also, the pressure can be up to 100,000 psi, in some cases up to 75,000 psi, in other cases up to 50,000 psi, in some situations up to 40,000 psi, and in other situations up to 30,000 psi. The pressure in the isopressing step can be any of the stated pressure values or can range between any of the pressure values stated above.

Suitable sintering conditions are those under which the $MoO_2$ powder forms a coherent bonded mass without melting. The length of time for sintering will depend on the sintering temperature. In an embodiment of the invention, the billet is sintered under vacuum or at a suitable partial pressure of oxygen for at least 15 minutes, in some cases at least 30 minutes, in other cases at least 1 hour, in some situations at least 2 hours, and in other situations at least 3 hours. Also, the billet can be vacuum sintered for up to 10 hours, in some cases up to 20 hours, in other cases up to 7 hours, in some situations up to 6 hours, and in other situations up to 5 hours. The period of time the billet is sintered under vacuum or at a suitable partial pressure of oxygen can be any of the stated periods of time or can range between any of the periods of time stated above.

In a further embodiment of the invention, the sintering temperature is at least 1,000° C., in some cases at least 1,100° C., in other cases at least 1,200° C., and in some situations at least 1,250° C. Also, the sintering temperature can be up to 2,500° C., in some cases up to 2,000° C., in some situations up to 1,750° C., and in other situations up to 1,500° C., depending on the exact composition of the $MoO_2$ powder and the billet. The sintering temperature can be any of the stated temperature values or can range between any of the temperature values stated above.

Any suitable pressing condition can be used in the present invention. Suitable pressing conditions are those at which the pressed and sintered $MoO_2$ powder can be formed into a plate while maintaining greater than 99% $MoO_2$ stoichiometry.

In an embodiment of the invention, the plate is subjected to hot isostatic pressing.

In a further embodiment of the present invention, the plate, formed by the method described above, has a density that is at least 85%, in some cases at least 90%, in other cases at least 95%, and can be up to 99%, and in some cases up to 100%, of the theoretical density of $MoO_2$. The density of the plate can be any of the stated density values or can range between any of the density values stated above.

A further embodiment of the present invention is directed to a method for sputtering that includes subjecting the plate including greater than 99% stoichiometric $MoO_2$ as described above to sputtering conditions, and thereby sputtering the plate.

Any suitable method of sputtering may be used in the invention. Suitable methods are those that are able to deposit a thin film on the plate. Examples of suitable sputtering methods include, but are not limited to, magnetron sputtering, pulse laser sputtering, ion beam sputtering, triode sputtering, and combinations thereof.

Other methods can be used in the invention, in addition to sputtering, to deposit thin films on the plate. Any suitable method of depositing a thin film in accordance with the invention may be used. Suitable methods of applying a thin film to the plate include, but are not limited to, electron beam evaporation and physical means such as physical vapor deposition.

The present invention is additionally directed to a method for making a thin film. The method includes the steps of sputtering a plate including greater than 99% stoichiometric $MoO_2$, removing $MoO_2$ molecules from the plate, and depositing the $MoO_2$ molecules onto a substrate to thereby form a thin film.

Suitable sputtering methods as described above can be used in this embodiment.

The thin film applied by the present method can have any desired thickness. The film thickness can be at least 0.5 nm, in some situations 1 nm, in some cases at least 5 nm, in other cases at least 10 nm, in some situations at least 25 nm, in other situations at least 50 nm, in some circumstance at least 75 nm, and in other circumstances at least 100 nm. Also, the film thickness can be up to 10 µm, in some cases up to 5 µm, in other cases up to 2 µm, in some situations up to 1 µm, and in other situations up to 0.5 µm. The film thickness can be any of the stated values or can range between any of the values stated above.

The present invention is also directed to thin films made in accordance with the invention as described above.

In an embodiment of the invention, the thin film has a work function that is higher as compared to the work function of indium-tin oxide films having the same dimensions. As such, the work function can be from 5.0 eV to 6.0 eV, and in some cases at least 5.2 eV, or any of the stated values individually.

In an embodiment of the invention, the thin film has a surface roughness that is less than the surface roughness as compared to a thin film of indium-tin oxide. More particularly, the surface roughness can be less 10 nm, in some cases less than 5 nm, in other cases less than 4 nm, and in some situations less than 3 nm. The surface roughness is typically greater than 0.1 nm. The surface roughness can be any of the stated values or can range between any of the values stated above.

In another embodiment of the invention, the thin film has a mean transmission of greater than 85% at a wavelength of from 350 to 800 nm.

In an additional embodiment of the invention, the thin film has a resistivity that is less than 500 µΩ·cm, in some cases less than 300 µΩ·cm and in other cases less than 250 µΩ·cm. The thin film resistivity is typically greater than 1 µΩ·cm. The thin film resistivity can be any of the stated values or can range between any of the values stated above. It is highly conducting with metallic behavior as a function of temperature.

In a particular embodiment of the invention a very thin film is provided. In this embodiment, the thin film is at least 100 Å, in some cases at least 250 Å, and in other cases at least 500 Å. In this embodiment, the thin film can be up to 5,000 Å, in some cases up to 3,000 Å, in other cases up to 2,500 Å, and in some situations up to 2,000 Å.

An embodiment of the invention is directed to an organic light-emitting diode that includes:
(a) a metal electrode;
(b) an electron transport layer;
(c) an emitter layer;
(d) an electrically conductive polymer (hole transport layer); and
(e) a thin film as described above located on a substrate.

Any suitable substrate may be used in the invention. Suitable substrates for the thin film used in the organic light-emitting diode include, but are not limited to, plastic substrates, glass substrates, ceramic substrates, and combinations thereof. The plastic substrates include, but are not limited to, polynorbornene, polyimide, polyarylate, polycarbonate, polyethylenenaphthanate (PEN), polyethyleneterephthalate (PET), and the like. A non-limiting example of a ceramic substrate includes sapphire.

The invention encompasses products used in various applications. In one embodiment, a thin film made in accordance to the invention can be used in thin film transistor (TFT)-liquid crystal display (LCD) applications. Also, in another embodiment, the invention encompasses a thin film used in solar cell applications and battery applications. In one embodiment, the invention is a containing LCD device containing that has both (i) a common electrode (about 1500 A) and (ii) a Pixel electrode (about 500 A). In thin film solar cell applications, the invention encompasses solar cells in which $MoO_2$ functions as a front electrode for the following illustrative device structure: $MoO_2$ front contact/p-layer/junction layer/n-layer/Al back contact, in which the p-layer releases electrons when it is struck by light, resulting in a lack of electrons, and n-layer is negatively charged. In another embodiment, the invention encompasses ohmic contacts (transparent, thin oxide/metal contacts) to both reduce the total contact resistance as well as allow emission of light from light emitting diodes (such as GaN LED), or diode lasers.

Other embodiments of the present invention are directed to optical display devices. In this embodiment, the optical display devices include a film that contains greater than 99% stoichiometric $MoO_2$ disposed over at least a portion of a substrate.

In an embodiment of the invention, the film can be formed by:
(a) sputtering a plate comprising greater than 99% stoichiometric $MoO_2$;
(b) removing $MoO_2$ molecules from the plate; and
(c) depositing the $MoO_2$ molecules onto the substrate, thereby forming a $MoO_2$ thin film.

In another embodiment, the film can be formed by:
(a) sputtering a plate comprising greater than 99% Mo;
(b) removing Mo molecules from the plate; and
(c) forming $MoO_2$ molecules under a partial pressure of oxygen in a chamber to produce the $MoO_2$ thin film onto the substrate.

Any suitable sputtering method can be used in the present invention. Suitable sputtering methods that can be used in accord with the invention include, but are not limited to, magnetron sputtering, pulse laser sputtering, ion beam sputtering, triode sputtering, and combinations thereof.

In an embodiment of the invention, the thin film has a thickness of at least 0.1 nm, in some cases at least 0.5 nm, in other cases at least 1 nm, in some situations at least 2 nm, in other situations at least 5 nm, in some instances at least 8 nm, in other instances at least 10 nm, and in particular situations at least 25 nm. Also, the film can have a thickness of up to 10 µm, in some cases up to 7.5 µm, in other cases up to 5 µm, in some situations up to 2.5 µm, in other situations up to 1 µm, in some instance up to 0.5 µm, in other instances up to 0.25 µm, and in particular instances up to 0.1 µm. The film thickness can be or can vary between any of the values recited above.

In another embodiment of the invention, in certain applications and uses, the thin film in the optical display device can have a film thickness of from 50 Å to 2,500 Å. In an embodiment of the invention, the thin film has a thickness of at least 50 Å, in some cases at least 100 Å, in other cases at least 250 Å, and in some situations at least 500 Å. Also, the film can have a thickness of up to 2,500 Å, in some cases up to 2,000 Å, in other cases up to 1,500 Å, and in some situations up to 1,000 Å. The film thickness can be or can vary between any of the values recited above.

In some embodiments of the present optical device, one or more suitable $MoO_2$ containing films are included. Non-limiting examples of suitable films include, but are not limited to single $MoO_2$ phase films, impurity-doped $MoO_2$ films, $MoO_2$-doped tin oxide films, $MoO_2$-doped indium tin oxide films, $MoO_2$-doped $ZnO/In_2O_3$ films, $MoO_2$-doped $ZnO/SnO_2/In_2O_3$ films, $MoO_2$-doped ZnO films, MoO2-doped SnO2 films, $MoO_2$-doped $ZnO/Al_2O_3$ films, $MoO_2$-doped Ga/ZnO films, $MoO_2$-doped GaO/ZnO films, $MoO_2$-doped zinc stannate ($Zn_2SnO_4$) films, and $MoO_2$—$MoO_3$ composite films.

The sputtering plate can be any suitable shape and size. As a non-limiting example, the sputtering plate can be in the shape of a square, a rectangle, a circle, or an oval. In a particular embodiment, the square sputtering plate can be square and have dimensions of from 0.1 cm×0.1 cm to 5 cm×5 cm, in some cases from 0.5 cm×0.5 cm to 4 cm×4 cm, in other cases from 1 cm×1 cm to 3 cm×3 cm, in some situations from 2 cm×2 cm to 3 cm×3 cm and in other situations, the square sputtering plate has dimensions of about 2.5 cm× about 2.5 cm.

In another particular embodiment, the rectangular sputtering plate can be have a shorter side of length at least 0.1 cm, in some cases at least 0.5 cm, in other cases at least 1 cm, in some situations at least 2 cm, in other situations at least 2.5 cm, in some instances at least 3 cm, in other instances at least 4 cm, and in particular situations at least 5 cm. Also, the longer side of the rectangle can be up to 6 cm, in some cases up to 5 cm, in other cases up to 4 cm, in some situations up to 3 cm, in other situations up to 2.5 cm, in some instance up to 2 cm, in other instances up to 1 cm and in particular instances up to 0.75 cm. The dimensions of the rectangular sputtering plate can vary between any of the dimensions recited above so long as the dimension of the longer side is greater than the dimension of the shorter side.

In another particular embodiment of the invention, the $MoO_2$ or $MoO_2$ containing sputtering target can be bonded to a backing plate to form a large area sputtering target. In a particular embodiment, a segment-forming sputtering method can be used.

The large area sputtering plate can be any suitable shape and size. As a non-limiting example, the large area sputtering plate can be in the shape of a square, a rectangle, a circle, or an oval, In a particular embodiment, the square sputtering plate can be square and have dimensions of from 0.1 m×0.1 m to 6 m×6 m, in some cases from 0.5 m×0.5 m to 5.5 m×5.5 m, in other cases from 1 m×1 m to 4 m×4 m, in some situations from 2 m×2 m to 3 m×3 m and in other situations, the square sputtering plate has dimensions of about 2.5 m×about 2.5 m.

In another particular embodiment, the large area rectangular sputtering plate can be have a shorter side of length at least 0.1 m, in some cases at least 0.5 m, in other cases at least 1 m, in some situations at least 2 m, in other situations at least 2.5 m, in some instances at least 3 m, in other instances at least 4 m, in particular situations at least 5 m, and in particular instances at least 5.5 m. Also, the longer side of the rectangle can be up to 6 m, in some cases up to 5 m, in other cases up to 4 m, in some situations up to 3 m, in other situations up to 2.5 m, in some instance up to 2 m, in other instances up to 1 m, and in particular instances up to 0.75 m. The dimensions of the large area rectangular sputtering plate can vary between any of the dimensions recited above so long as the dimension of the longer side is greater than the dimension of the shorter side.

In an embodiment of the present invention, film in the optical display devices is formed using one or more methods selected from the group consisting of metallo-organic chemical vapor deposition (MOCVD), metallo-organic deposition (MOD), and Sol-Gel technique.

As used herein, MOCVD, or "Metallo-Organic Chemical Vapor Deposition" refers to a chemical vapor deposition method of film growth in which all materials to be deposited are present in a vapor phase above the deposition surface. In MOCVD, the sources of chemical vapor deposition are metallo-organic compounds which have oxygen as a hetero atom in order to bond a metal atom to one or more organic ligands. As a non-limiting example, molybdenum ethyl-hexanoate can be used as a metallo-organic precursor to produce a $MoO_2$ thin film. As a particular, non-limiting example, precursors can be contained in vitreous silica boats or in a vitreous silica reaction tube, and the compounds are heated close to the boiling point, after which an argon carrier gas is introduced with suitable oxygen partial pressure to oxidize the compound under reducing atmosphere to produce $MoO_2$ molecules and subsequently deposit onto substrates in a reaction chamber.

As used herein, "Sol-Gel Process" refers to processing using metal alkoxides of network forming cations as solution precursors. As a non-limiting example, the cations can be $M(OR)_x$ where M represents a metal and R represents an alky group. Further to this example, the starting alkoxide for the sol-gel $MoO_2$ can be molybdenum acetyl-acetonate (in methanol). Hydrolysis can then be accomplished by combining the solution with ethanol to yield a polymerized solution. The precursor solution is stable for only a few days, after which time clarity is lost and gelation can occur. The precursor solution can be applied onto the substrate, followed by spinning at, for example, 1000 rpm to produce a thin wet film. Another technique to produce a thin film is by immersion of the substrates in precursor solution using a withdrawal rate of, for example, 580 mm/min. The wet films can then be heat-treated in a vacuum and hydrogen atmosphere (a reducing atmosphere) to give rise to $MoO_2$ thin film on substrates.

As used herein, the terms "MOD Process" or "Metallo-Organic Decomposition Process" refer to processes that are similar to MOCVD and/or Sol-Gel processes. In an MOD process, metallo-organic compounds as precursors, which have oxygen as the hetero atom to bond a metal atom to one or more organic ligands, are also used. The compounds are dissolved in appropriate solvents, a non-limiting example being xylene. As a non-limiting example, molybdenum ethyl-hexanoate or molybdenum acetylacetonate can be used as a metallo-organic compound to produce $MoO_2$ thin film. After adjusting the rheology of the solution, the liquid films are formed by spinning the precursor solution on the substrates.

Typically, the last step in an MOD Process is pyrolysis, which involves solvent evaporation, thermal decomposition of the compounds, and solid solution to form a $MoO_2$ film under suitable oxidation and reducing atmosphere.

In an embodiment of the invention, in an MOD Process, in addition to pure $MoO_2$ phase thin film, a $MoO_2$ containing film can also be produced by mixing several different metallo-organic solutions. As a non-limiting example, molybdenum ethyl-hexanoate can be mixed with tin ethyl-hexanoate in a solvent, such as xylene, at a ratio whereby a desired stoichiometry is achieved. After spinning to produce a wet film on a substrate, pyrolysis at suitable partial pressure of oxygen is conducted, producing a molybdenum tin oxide thin film ($MoO_2$ containing film).

In an embodiment of the invention, the MOCVD or MOD techniques utilize metallo-organic chemicals including molybdenum ethyl-hexanoate.

In an embodiment of the present invention the thin film in the present optical device can have a work function of from 4.5 to 6 eV, in some cases from 4 to 5.5 eV, and in some situations from 4.5 to 5.5 eV.

In another embodiment of the present invention, the thin film can generally have a roughness of less than about 5 nm, in some cases from 0.1 nm to 5 nm, and in other cases from 0.1 to 2.5 nm.

In a further embodiment of the present invention, the thin film can have a mean transmission of greater than 85%, in some cases greater than 90%, and in other cases greater than 95% at a wavelength of from 350 nm to 800 nm.

In an additional embodiment of the invention, the thin film can have a resistivity of less than 300 $\mu\Omega\cdot cm$, in some cases less than 250 $\mu\Omega\cdot cm$ and in other cases less than 200 $\mu\Omega\cdot cm$.

In a particular embodiment of the invention, the optical device is an organic light emitting diode and the $MoO_2$ containing film is an anode.

Further to this embodiment, the organic light-emitting diode includes:
  (a) a metal cathode;
  (b) an electron transport layer;
  (c) an emitting layer;
  (d) a hole transport layer; and
  (e) the film comprising $MoO_2$ as an anode layer.

In some aspects of this embodiment, the thin film can be located on a substrate selected from plastic substrates, glass substrates, ceramic substrates, and combinations thereof. As a non-limiting example, the plastic substrate can include one or more plastics selected from polynorbornene, polyimide, polyarylate, polycarbonate, polyethylene-naphthanate, and polyethyleneterephthalate. Also, as a non-limiting example, the ceramic substrate can include sapphire.

In another embodiment of the invention, the optical device is a light emitting diode and the $MoO_2$ containing thin film can be an ohmic contact. Further to this embodiment, the light-emitting diode can include:
  (a) a substrate;
  (b) a buffer layer;
  (c) an N-type semiconductor material;
  (d) a junction layer;
  (e) a P-type semiconductor material;
  (f) a p-type metal contact; and
  (g) an n-type metal contact.

Non-limiting examples of suitable substrates are those that include a material selected from sapphire, SiC, Si, GaN, GaP, GeSi, AlN, and combinations thereof. Non-limiting examples of suitable buffer layer materials are those that include one or more compounds of Group IIIB elements and Group VB elements from the periodic table of the elements. As used herein, the term "periodic table of the elements" refers to the periodic table format used by the IUPAC. In a particular embodiment of the invention, the buffer layer includes AlN, GaN, or a combination thereof.

In another aspect of the light emitting diode embodiment of the invention, the N-type semiconductor material can include, but is not limited to, materials containing one or more compounds doped with one or more elements selected from Si, Se, Te, and S. Non-limiting examples of such compounds include compounds of Group IIIB elements and Group VB elements from the periodic table of the elements and compounds selected from compounds of Group IIB elements and Group VIB elements from the periodic table of the elements. Non-limiting examples of suitable compounds of Group IIIB elements and Group VB elements include Si-doped compounds selected from GaN, GaAs, GaAlAs, AlGaN, GaP, GaAsP, GaInN, AlGaInN, AlGaAs, AlGaInP, PbSnTe, PbSnSe, and combinations thereof. Non-limiting examples of suitable compounds of Group IIB elements and Group VIB elements include Si-doped compounds selected from ZnSSe, ZnSe, SiC, and combinations thereof.

In another aspect of the light emitting diode embodiment of the invention, the thin film can be an n-type metal contact. In particular embodiments of the invention, the n-type metal contact can include a material selected from Ti/Au metals, a $MoO_2$ conducting oxide and a $MoO_2$/metal where the metal is selected from Ti, Au, and combinations thereof.

In another aspect of the light emitting diode embodiment of the invention, the P-type semiconductor material can include one or more compounds doped with one or more elements selected from Mg, Zn, and C. Suitable compounds in this aspect of the invention include compounds of Group IIIB elements and Group VB elements from the periodic table of the elements and compounds selected from compounds of Group IIB elements and Group VIB elements from the periodic table of the elements. Non-limiting examples of suitable compounds of Group IIIB elements and Group VB elements include Mg-doped compounds selected from GaN, GaAs, GaAlAs, AlGaN, GaP, GaAsP, GaInN, AlGaInN, AlGaAs, AlGaInP, PbSnTe, PbSnSe, and combinations thereof. Non-limiting examples of suitable compounds of Group IIB elements and Group VIB elements include Mg-doped compounds selected from ZnSSe, ZnSe, SiC, and combinations thereof.

In another aspect of the light emitting diode embodiment of the invention, the thin film can be a p-type metal contact. In particular embodiments of the invention, the p-type metal contact includes a material selected from a $MoO_2$ containing transparent conducting oxide and a $MoO_2$ containing/metal films where the metal is selected from Ag, Au, and combinations thereof.

In an embodiment of the invention, the optical device can be a liquid crystal display and the $MoO_2$ containing thin film is one or more of a common electrode, a pixel electrode, a gate electrode, a source electrode, a drain electrode, a storage-capacitor electrode, and combinations thereof. Further to this embodiment, the liquid display crystal can include a thin film diode or thin film transistor switching element.

Aspects of the liquid crystal display embodiment of the invention include liquid display crystals that include:
  A) a glass substrate,
  B) a source electrode,
  C) a drain electrode,
  D) a gate insulator,
  E) a gate electrode,
  F) an amorphous-silicon, polycrystalline-silicon or single crystal silicon layer,
  G) an n-doped silicon layer,
  H) a passivation layer,
  I) a pixel transparent electrode,
  J) a common electrode,
  K) a polyimide alignment layer, and
  L) a storage-capacitor electrode.

In some aspects of this embodiment, the pixel transparent electrode and the common electrode can include the $MoO_2$ containing film.

Another embodiment of the present invention is directed to those situations where the optical device is a plasma display panel and the $MoO_2$ containing film is a positive or negative electrode. In this embodiment, the plasma display panel can include:

A) a front glass plate,
B) a dielectric film,
C) an MgO layer,
D) an ionized gas,
E) a separator,
F) one or more phosphors, and
G) a back glass plate.

In some aspects of this embodiment, the back glass can be coated with the $MoO_2$ thin film.

Further embodiments of the invention are directed to the situations where the optical device is a field emission display and the $MoO_2$ containing thin film is an anode or cathode electrode material. In this embodiment, the field emission display can include:

A) a glass face plate anode,
B) a phosphor,
C) a spacer,
D) a microtip,
E) row and column cathodes, and
F) a glass base plate.

In some aspects of this embodiment, the glass face plate A) is coated with the $MoO_2$ containing thin film. In another aspect of this embodiment, at least one of the row and column cathodes E) can include the $MoO_2$ containing thin film.

In an additional embodiment of the invention, the optical device can be a solar cell and the $MoO_2$ containing film can be one or more of electrical contacts, a transparent contact, and a top junction layer. In this embodiment, the solar cell can include:

A) a cover glass,
B) a top electric contact layer,
C) a transparent contact,
D) a top junction layer,
E) an absorber layer,
F) a back electric contact, and
G) a substrate.

In some aspects of this embodiment, the transparent contact C) can include the $MoO_2$ containing film. In another aspect of this embodiment, the top junction layer D) can include the $MoO_2$ containing film. In a further aspect of this embodiment, the cover glass A) can include an anti-reflective coating.

EXAMPLES

Example 1

Four different MoO2-powders were characterized concerning their sintering- and shrinkage behavior by means of a dilatometer. Small samples of about Ø8*10 mm were pressed with a steel die and post-compacted by cold-isostatic pressing (CIP). The four MoO2-powders showed the following characteristics:

| Denomination | Impurity content ppm | Specific surface area m^2/g | Mineralogical phases |
|---|---|---|---|
| MoO-P 1 | >100 | 0.5 | MoO2 |
| MoO-P 2 | <50 | 1.0 | MoO2 |
| MoO-P 3 | <50 | 2.3 | MoO2, Traces Mo4O11, MoO3 |
| MoO-P 4 | <50 | 2.0 | MoO2 |

MOO2-POWDERS USED FOR DENSIFICATION EXPERIMENTS

Heating up with a rate of 5 K/min to 1250° C. in Ar-3H2-atmosphere in the dilatometer, samples made of MoO—P 1, 2 and 4 showed diminishing expansion and densification and ended up with a density comparable to the starting density "as-pressed" of about 3.5 g/cm^3. In spite of this, sample made of MoO—P 3 showed a beginning shrinkage at about 600° C. which continued till reaching the maximum temperature of 1250° C. The recorded shrinkage amounted to 10.3%, the measured density after the dilatometric run was 4.1 g/cm^3.

These results were interpreted in the way that neither the impurity content nor the specific surface area of the powders are of significant influence on the densification behavior in opposite to the mineralogical phases.

Example 2

Samples of about Ø30*5 mm were prepared in the same way as described in trial 1 from MoO—P 1 to 4. The "as-pressed" density was about 3.5 g/cm^3. These samples were sintered in a gas-tight Al2O3-lined furnace in Ar-3H2-atmosphere, placed on recrystallized SiC-plates. With a heating rate of 5 K/min, temperature was increased to 1100, 1150, 1200, 1250 and 1300° C., respectively, followed by 1 to 5 h soaking time. Up to 1200° C., a slight increase in density could be determined after the sintering cycle to about 3.8 g/cm^3 with the exception of samples made of MoO—P 3 which reached up to 4.1 g/cm^3. Further increases of the temperature resulted in again reduced densities and rising weight losses. These results again were interpreted in the way that neither the impurity content nor the specific surface area of the powders are of significant influence on the sintering behavior in opposite to the mineralogical phases.

Example 3

MoO—P powder 4 was placed in a Mo-foil lined hot-press die made of graphite. Various hot-pressing tests were performed at increasing temperatures, starting with 750°, 1000° and finally 1300° C. Maximum pressure of 30 MPa was applied at 600° C. in order to run the hot-press as a dilatometer to registrate the densification as a function of temperature. The heating and cooling rate were 10 K/min, as atmosphere, again Ar-3H2 was applied. None of these conditions led to a strong, densified sample. Mostly it broke during ejection form the die and was as soft to be scratched by finger nail. At the 1300° C. trial, already severe reaction with the Mo-foil occurred leading to strong sticking.

Example 4

MoO—P 4 was mixed with 2.5 wt. % fine MoO3-powder. Mixing occurred on a roller frame for 5 hours within a plastic bottle in the dry state using Al2O3-balls to support distribution. The mixed powder was sieved <300 μm and used for a further hot-pressing test. Maximum pressure of 30 MPa was applied at 600° C. in order to run the hot-press as a dilatometer to registrate the densification as a function of temperature. The heating and cooling rate were 10 K/min, as atmosphere, again Ar-3H2 was applied. The system registrated an onset of densification at about 700° C. which continued till about 800° C. Further rise in temperature did not result in further densification. After ejection, a density of about 5.9 g/cm^3 was determined. There was no reaction with the Mo-isolation foil. By XRD, only MoO2-phases could be detected. There were no indications for the presence of crystalline Mo-phases with an O/Mo-ratio>2 above the XRD detection limit. This supports the conclusion that a few percent of Mo-phases with an O/Mo-ratio>2 allow to densify MoO2-powders (within the limits of characteristics shown above) by hot-pressing to near theoretical density at relatively low temperatures.

Example 5

To analyze the influence of the amount of MoO3 addition on the densification of $MoO_2$-powder in hot-pressing, MoO—P 2 was mixed with 2, 3 and 5 wt. % MoO3-powder, respectively, acc. to trial 4. Hot-pressing conditions were fixed to be 750° C., 30 min soaking time, 30 MPa pressure and Ar-3H2 atmosphere. As an isolation foil, graphite was used.

With these conditions, sample #1 with 1 wt. % MoO3-admixture reached a density of 4.5 g/cm³ while sample #2 with 3 wt. % and sample #3 with 5 wt. % MoO3 addition reached a density of 6.1 g/cm^3. There was no indication for a reaction between the sample material and the graphite isolation foil. These samples were hard and could not be scratched by finger nail. By XRD, only MoO2-phases could be detected, there were no indications for the presence of crystalline Mo-phases with an O/Mo-ratio>2 above the XRD detection limit.

With the addition of 3 wt. % MoO2 according to the procedure described in trial 4 and the hot-pressing conditions like above but prolonged soaking times, plates with densities of >6.0 g/cm^3 could be prepared with Ø 50-250 mm and a thickness up to about 20 mm. Thus, this procedure is suitable to prepare highly dense MoO2-plates of sizes of technical interest.

The invention and various embodiments thereof have been described above. It will be obvious to those skilled in the art that various changes and modifications may be made therein without departing from the scope of the invention as defined in the specification and the appended claims.

We claim:

1. A method for making a plate comprising:
   (a) isopressing a greater than 99% stoichiometric $MoO_2$ powder component to a billet;
   (b) vacuum sintering the billet under conditions to maintain the greater than 99% $MoO_2$ stoichiometry; and
   (c) forming a plate comprising greater than 99% stoichiometric $MoO_2$.

2. The method of claim 1, wherein the billet is vacuum sintered for 6 hours at a temperature of at least 1250° C.

3. The method of claim 1, wherein the $MoO_2$ powder is isopressed at a pressure ranging from 10,000 psi to 40,000 psi.

4. The method of claim 1, wherein the plate is subjected to hot isostatic pressing.

5. The method of claim 1, wherein the plate has a density that is from 90% to 100% of the theoretical density of $MoO_2$.

6. A plate made in accordance to the method of claim 1.

* * * * *